(12) United States Patent
Meng et al.

(10) Patent No.: US 9,204,540 B2
(45) Date of Patent: *Dec. 1, 2015

(54) CAPACITANCE TOUCH PANEL MODULE AND FABRICATION METHOD THEREOF

(71) Applicant: INNOLUX CORPORATION, Miaoli County (TW)

(72) Inventors: Kai Meng, Miaoli County (TW); Lien-Hsin Lee, Miaoli County (TW)

(73) Assignee: INNOLUX CORPORATION, Miaoli County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/560,592

(22) Filed: Dec. 4, 2014

(65) Prior Publication Data

US 2015/0083567 A1    Mar. 26, 2015

Related U.S. Application Data

(63) Continuation of application No. 14/246,788, filed on Apr. 7, 2014, which is a continuation of application No. 12/718,068, filed on Mar. 5, 2010, now Pat. No. 8,729,910.

(30) Foreign Application Priority Data

Sep. 22, 2009  (CN) .......................... 2009 1 0307440

(51) Int. Cl.
*G06F 3/044*   (2006.01)
*H05K 1/02*    (2006.01)
*H05K 1/03*    (2006.01)
*H05K 3/10*    (2006.01)

(Continued)

(52) U.S. Cl.
CPC .............. *H05K 1/0296* (2013.01); *G06F 3/044* (2013.01); *H03K 17/9622* (2013.01); *H05K 1/0274* (2013.01); *H05K 1/0306* (2013.01); *H05K 3/10* (2013.01); *H05K 3/125* (2013.01);

(Continued)

(58) Field of Classification Search
CPC .............. G06F 3/044; G06F 2203/041; G06F 2203/04103; G06F 2203/04111; H05K 1/0274; H05K 1/0306; H05K 3/10; H05K 3/125; H05K 2201/0108; H05K 2201/017; H03K 17/9622; H03K 2017/9613; H03K 2217/96075; H03K 2217/960765; H03K 2217/960755; Y10T 29/49105; Y10T 29/49155; Y10T 29/49162
USPC .................... 200/5 R, 600; 345/173; 324/173
See application file for complete search history.

(56) References Cited

U.S. PATENT DOCUMENTS 8,729,910 B2 *  5/2014  Meng et al. .................. 324/658
8,921,727 B2 * 12/2014  Sun ............................... 200/600

(Continued)

*Primary Examiner* — Edwin A. Leon
(74) *Attorney, Agent, or Firm* — WPAT, PC; Justin King

(57) ABSTRACT

A method of fabricating a capacitance touch panel module includes forming a plurality of first conductive patterns on a substrate comprising a touching area and a peripheral area along a first orientation, a plurality of second conductive patterns along a second orientation, and a plurality of connecting portions in the touching area; forming a plurality of insulated protrusions, in which each insulated protrusion covering one connecting portion, and forming an insulated frame on the peripheral area; and forming a bridging member on each insulated protrusion.

13 Claims, 9 Drawing Sheets

(51) Int. Cl.
  *H05K 3/12* (2006.01)
  *H03K 17/96* (2006.01)

(52) U.S. Cl.
  CPC .............. *G06F 2203/041* (2013.01); *G06F 2203/04103* (2013.01); *G06F 2203/04111* (2013.01); *G06F 2203/04112* (2013.01); *H03K 2017/9613* (2013.01); *H03K 2217/96075* (2013.01); *H03K 2217/960755* (2013.01); *H03K 2217/960765* (2013.01); *H05K 2201/017* (2013.01); *H05K2201/0108* (2013.01); *Y10T 29/49105* (2015.01); *Y10T 29/49155* (2015.01); *Y10T 29/49162* (2015.01)

(56) References Cited

U.S. PATENT DOCUMENTS

| | | | |
|---|---|---|---|
| 2005/0030048 A1 | 2/2005 | Bolender et al. | |
| 2006/0088698 A1 | 4/2006 | Majumdar et al. | |
| 2008/0007534 A1* | 1/2008 | Peng et al. | 345/173 |
| 2008/0264699 A1 | 10/2008 | Chang et al. | |
| 2008/0309635 A1* | 12/2008 | Matsuo | 345/173 |
| 2009/0160817 A1 | 6/2009 | Wu et al. | |
| 2010/0295819 A1* | 11/2010 | Ozeki et al. | 345/174 |
| 2015/0083565 A1* | 3/2015 | Meng et al. | 200/5 R |
| 2015/0083566 A1* | 3/2015 | Meng et al. | 200/5 R |

* cited by examiner providing a substrate comprising a touching area and a peripheral area around the touching area — S101 forming a plurality of first conductive patterns, a plurality of second conductive patterns, and a plurality of connecting portions; the first conductive patterns arranged in a plurality of rows along a first orientation, the second conductive patterns arranged between neighboring rows of the first conductive patterns, wherein each connecting portion connects two neighboring first conductive patterns arranged in a row, and the first conductive patterns are electrically insulated from the second conductive patterns — S103 forming a plurality of insulated protrusions in the touching area and an insulated frame in the peripheral area, wherein each insulated protrusion covers one connecting portion — S105 forming a bridging member on each insulated protrusion, the bridging member electrically connecting two neighboring second conductive patterns — S107

FIG. 1

CAPACITANCE TOUCH PANEL MODULE AND FABRICATION METHOD THEREOF

CROSS REFERENCE TO RELATED PATENT APPLICATION

This application is a continuation application of and claims priority benefit of pending U.S. application Ser. No. 14/246,788, filed on Apr. 7, 2014, which claims the priority benefit of U.S. application Ser. No. 12/718,068, filed on Mar. 5, 2010, patented on May 20, 2014, with U.S. Pat. No. 8,729,910, which claims the benefit of Chinese application Serial No. 200910307440.0, filed on Sep. 22, 2009. The entirety of the above-mentioned patent application is incorporated herein by reference and made a part of this specification.

BACKGROUND

1. Technical Field

The present disclosure generally relates to capacitance touch panel modules, and particularly, to a capacitance touch panel module and a fabrication method thereof.

2. Description of Related Art

Capacitance touch panels are often used in portable electronic devices due to their dustproof, multi-touch capabilities, and thermostable properties.

A commonly used capacitance touch panel module includes a touch panel and a cover lens bonded thereto by using optical adhesive. The touch panel includes a base plate, two transparent conductive layers, and two insulating layers. The conventional touch panel module having five layers, in combination with a possibly-added cover lens, results in an overly thick unit having lesser than optimum light transmittance, and reduced quality. In addition, the optical adhesive is expensive and cannot be recycled.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

FIGS. 1 through 5 show a first embodiment of a method of fabricating a capacitance touch panel module.

DETAILED DESCRIPTION

Figure 2:
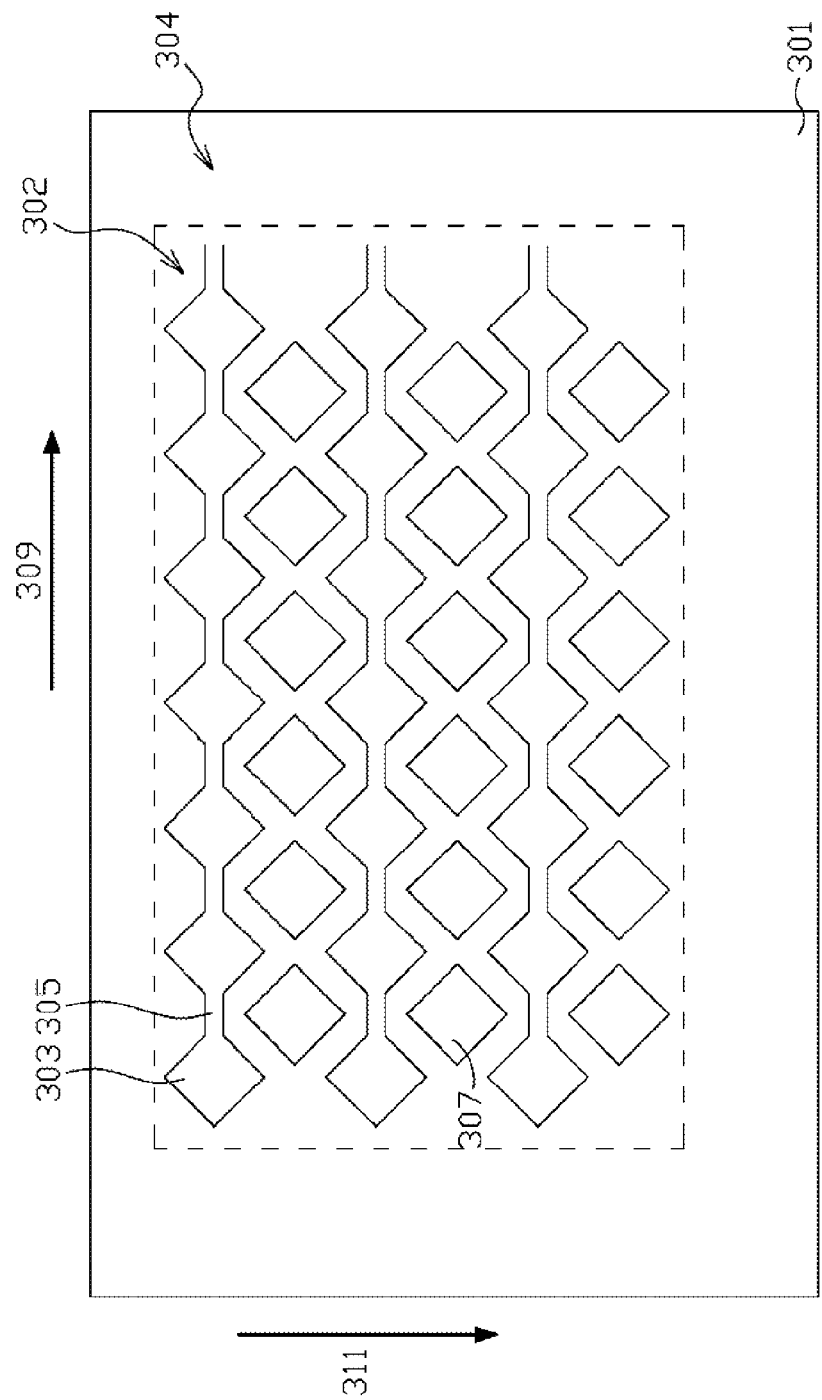

Referring to FIGS. 1 and 2, a first embodiment of a method of fabricating a capacitance touch panel module is described as follows. A substrate 301 with a touching area 302 and a peripheral area 304 arranged around the touching area 302 is provided. The substrate 301 may be made of glass, quartz, plastic, resin, acrylic fabric, or other transparent material.

A transparent conductive layer (not shown) is formed on the substrate 301 of indium tin oxide (ITO), indium zinc oxide (IZO), aluminum zinc oxide (AZO), gallium zinc oxide (GZO), magnesium indium oxide (MIO), or other transparent conductive materials. The transparent conductive layer is etched to form a plurality of first conductive patterns 303, a plurality of second conductive patterns 307, and a plurality of connecting portions 305 in the touching area 302. The first conductive patterns 303 are arranged in a plurality of rows along a first orientation 309. The second conductive patterns 307 are arranged between the neighboring rows of the first conductive patterns 303. Each connecting portion 305 connects two neighboring first conductive patterns 303 which are arranged in a row. The first conductive patterns 303 are electrically insulated from the second conductive patterns 307.

Figure 3:
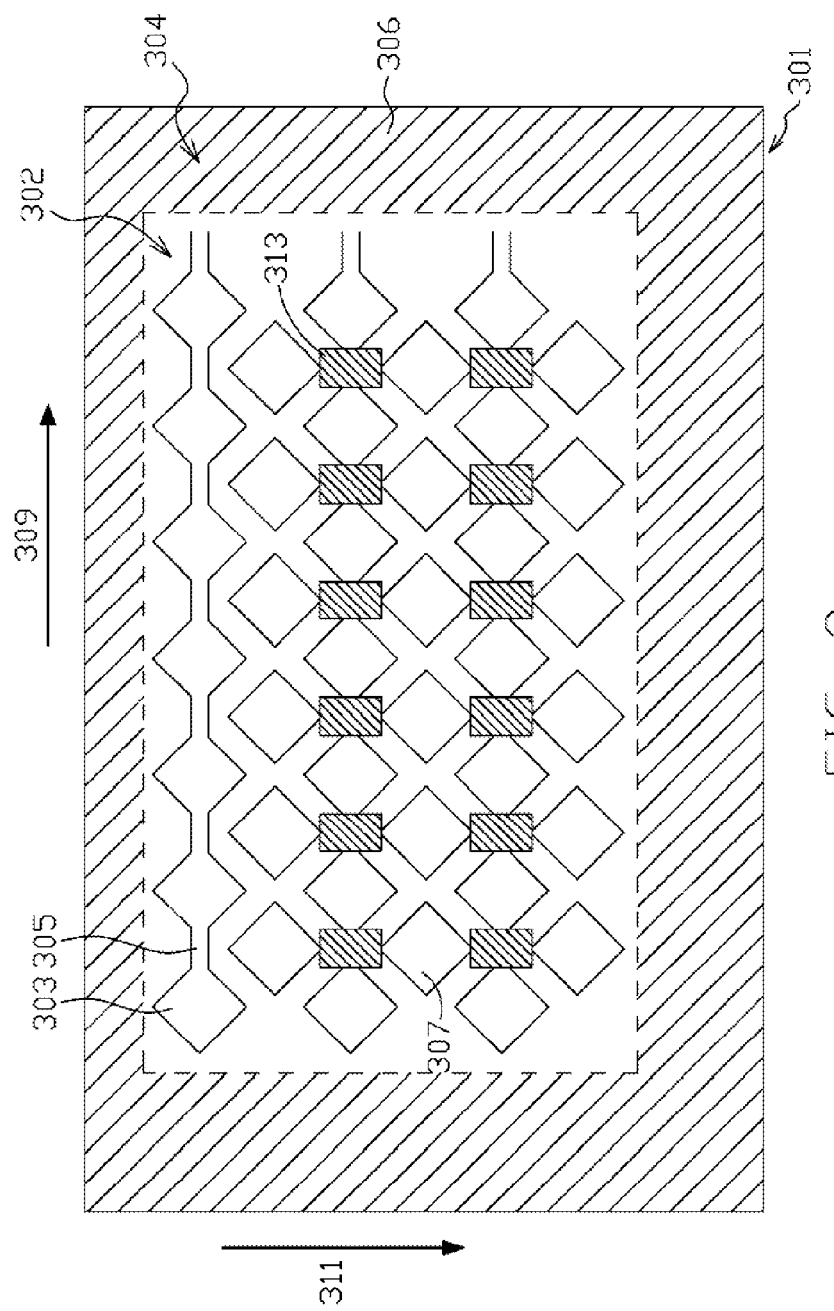

Referring to FIG. 3, a photoresist layer (not shown) or similar types of photosensitive insulating layer is formed on the substrate 301 and undergoes lithography to form a plurality of insulated protrusions 313 in the touching area 302 and forms an insulated frame 306 covering the peripheral area 304. Each insulated protrusion 313 covers one connecting portion 305 and at least part of the first conductive pattern 303 connecting with the connecting portion 305. The insulated protrusions 313 and the insulated frame 306 may be made of light absorption material to obtain a shading effect.

The insulated protrusions 313 and the insulated frame 306 may also be photo etched. In detail, an insulated layer may be formed on the substrate 301, followed by a photoresist layer formed on the insulated layer, and the photoresist layer may be formed by lithography, after which the insulated layer may be etched through the developed photoresist layer to form the insulated protrusions 313 and the insulated frame 306. Alternatively, the insulated protrusions 313 and the insulated frame 306 may be formed by ink jet printing.

The method may also include baking for about one hour at 200° C. to 300° C., preferably at 220° C. The surface of each insulated protrusion 313 becomes curved after baking due to cohesion of the insulated protrusions 313.

Figure 4:
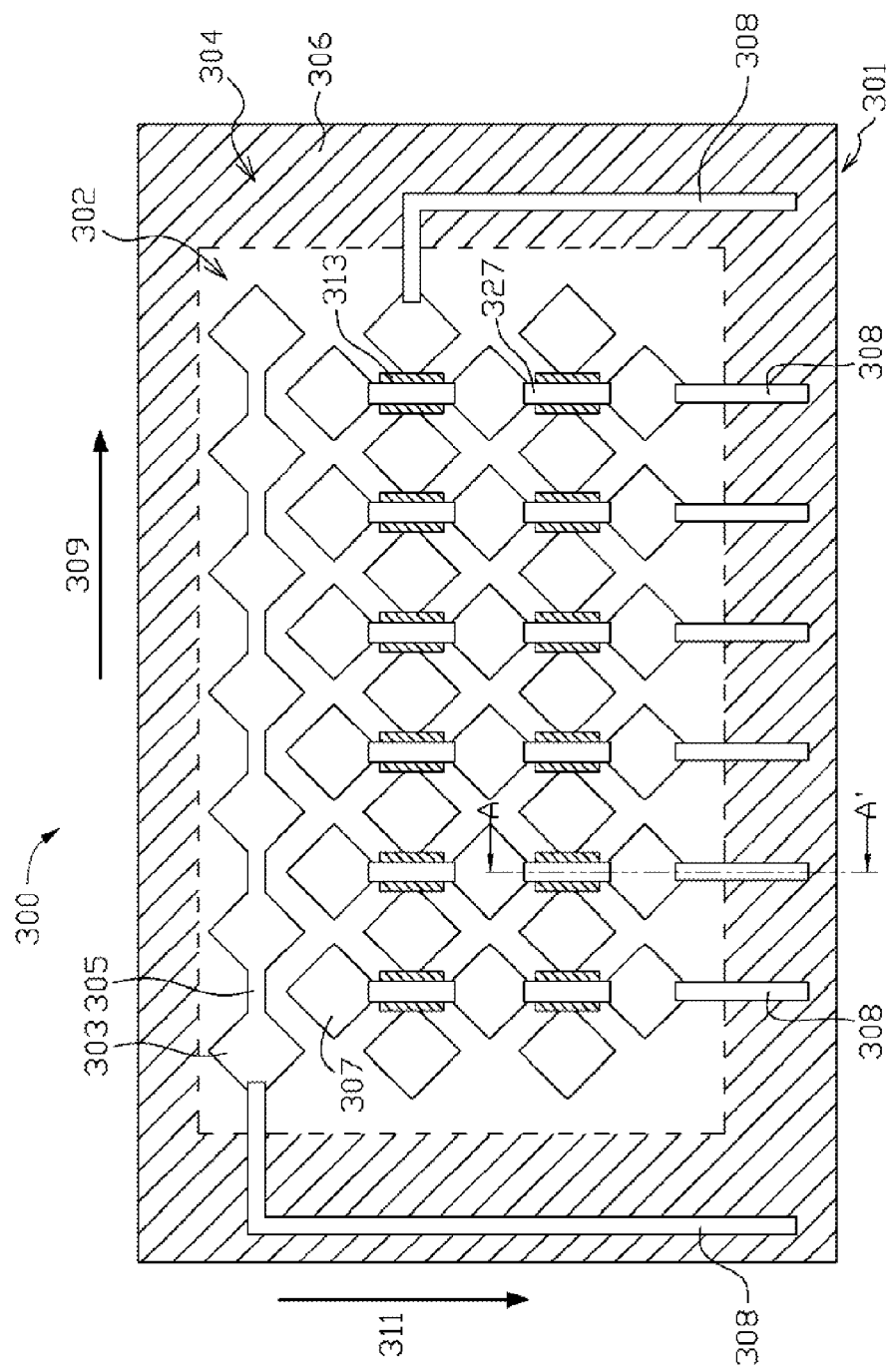

Referring to FIG. 4, a metallic layer (not shown) is deposited on the substrate 301, with a plurality of bridging members 327 formed in the touching area 302 and a plurality of conductive wires 308 formed in the insulated frame 306. Each bridging member 327 covers one insulated protrusion 313 and electrically connects two neighboring second conductive patterns 307 along a second orientation 311. Parts of the conductive wires 308 connect with parts of the first conductive patterns 303, respectively. The other parts of the conductive wires 308 connect with parts of the second conductive patterns 307.

Figure 5:
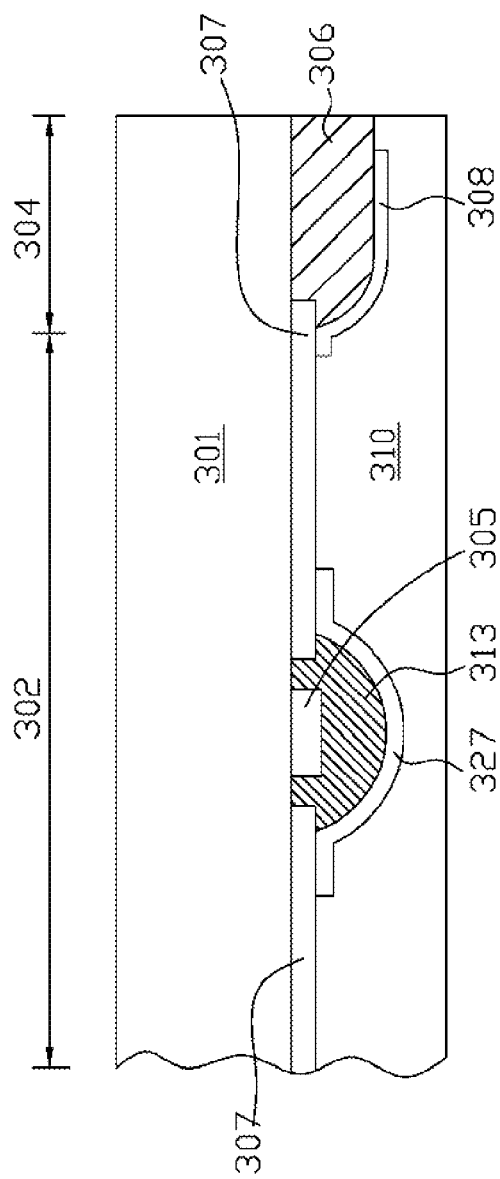

Referring to FIG. 5, a protective layer 310 is formed on the substrate 301 covering the entire touching area 302 and the entire peripheral area 304 to protect the contact structure (not labeled) and the conductive wires 308. The contact structure includes the first conductive patterns 303, the second conductive patterns 307, the bridging members 327, the insulated protrusions 313, and the connecting portions 305. The protective layer 310 may be silicon oxide, silicon nitride, or other materials.

Referring to FIGS. 1 through 5, the first embodiment of the method of fabricating a capacitance touch panel module is described in the following: in step S101, a substrate 301 comprising a touching area 302 and a peripheral area 304 around the touching area 302 is provided; in step S103, a plurality of first conductive patterns 303, a plurality of second conductive patterns 307, and a plurality of connecting portions 305 is formed, in which the first conductive patterns 303 are arranged in a plurality of rows along a first orientation 309, the second conductive patterns 307 are arranged between neighboring rows of the first conductive patterns 303, wherein each connecting portion 305 connects two neighboring first conductive patterns 303 arranged in a row, and the first conductive patterns 303 are electrically insulated from the second conductive patterns 307; in step S105, a plurality of insulated protrusions 313 in the touching area 302 and an insulated frame 306 in the peripheral area 304 are formed, wherein each insulated protrusion 313 covers one connecting portion 305; in step S107, a bridging member 327 is formed on each insulated protrusion 313, and the bridging member 327 electrically connects two neighboring second conductive patterns 307.

Figure 6:
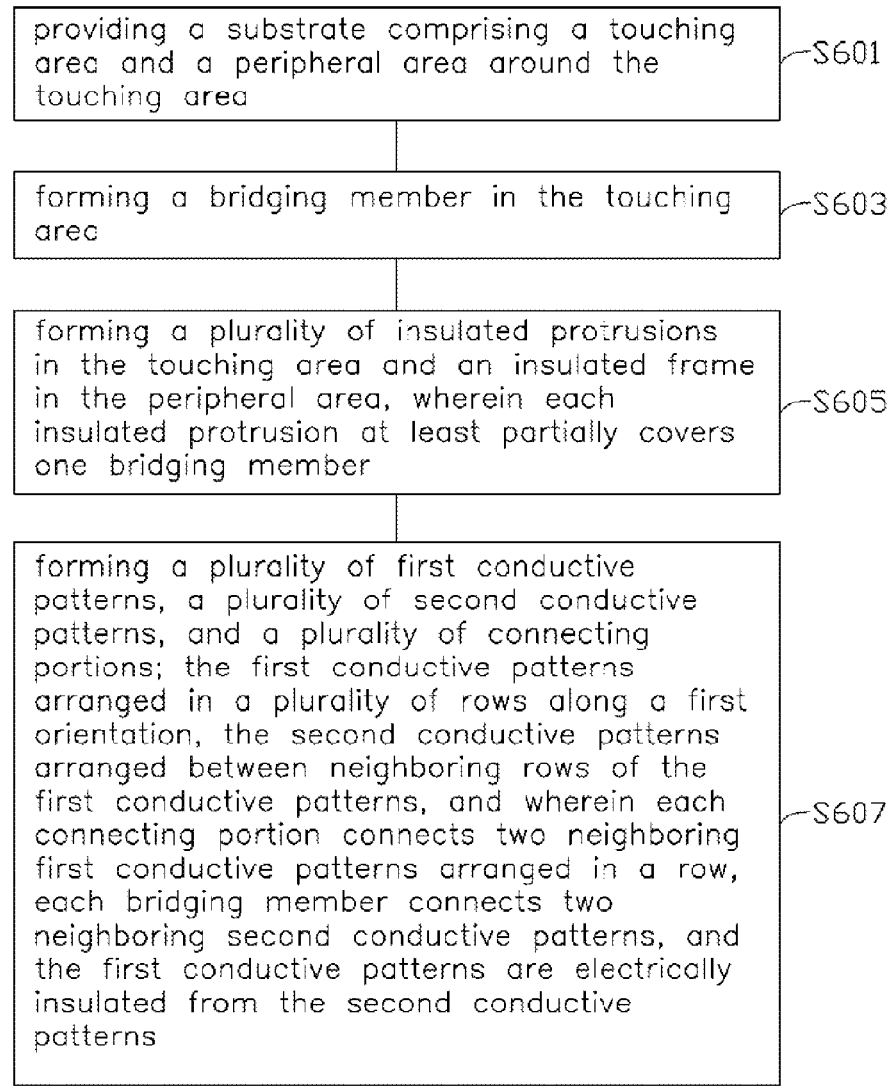
FIGS. 6 through 9 show a second embodiment of a method of fabricating a capacitance touch panel module.
Figure 7:
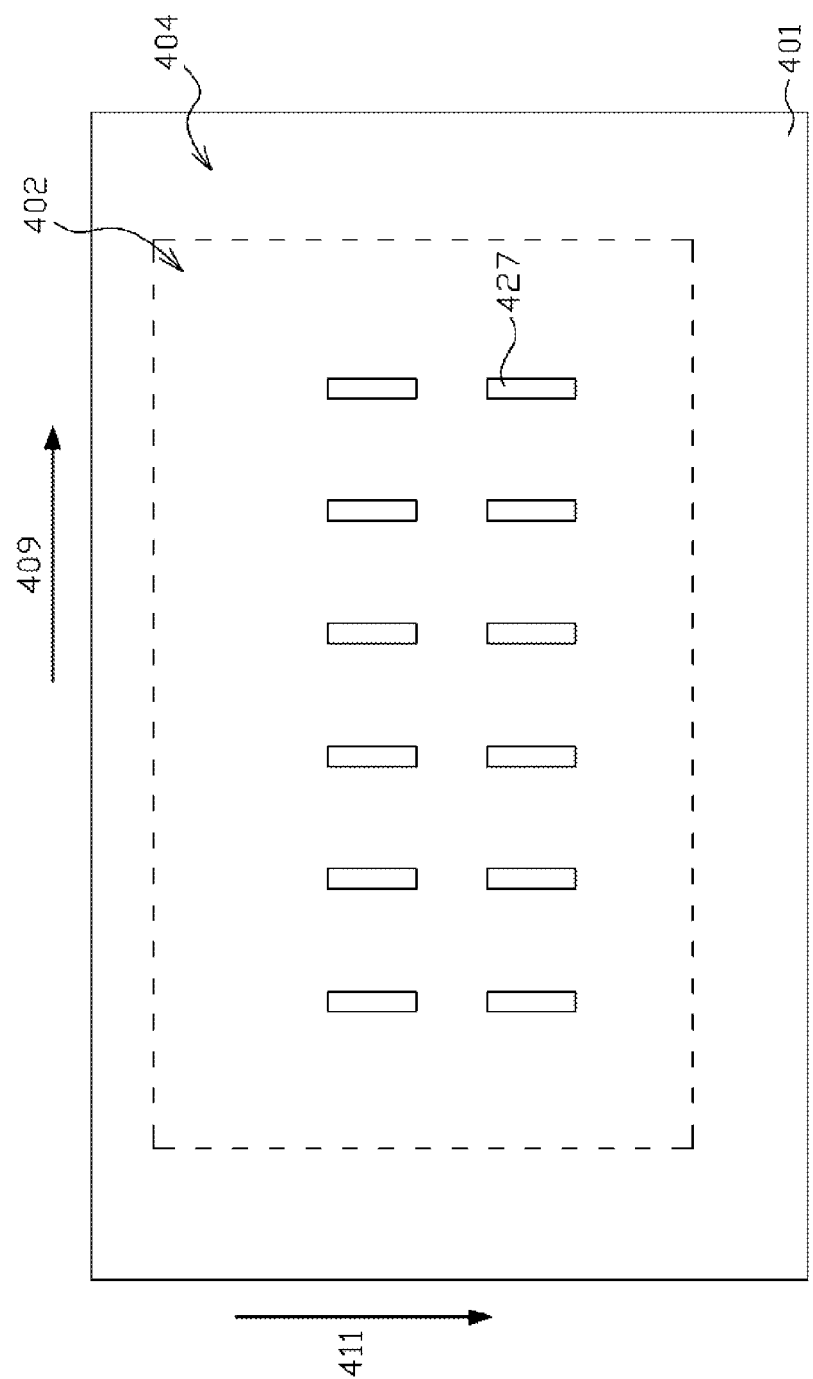

Referring to FIGS. 6 and 7, a second embodiment of a method of fabricating a capacitance touch panel module is described as follows. A substrate 401 with a touching area 402 and a peripheral area 404 arranged around the touching area 402 is provided. A plurality of bridging members 427 is formed in the touching area 402.

Figure 8:
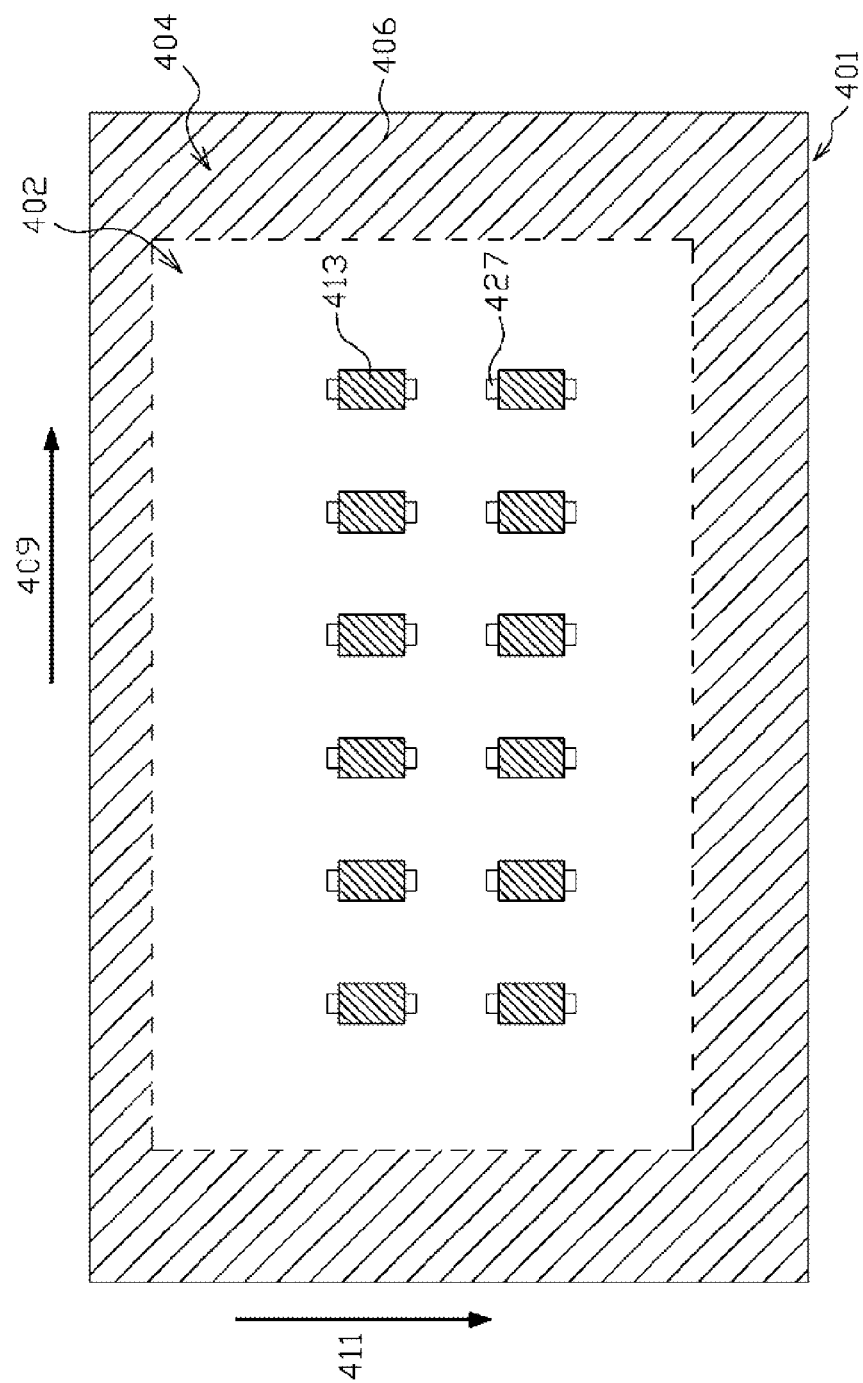

Referring to FIG. 8, a plurality of insulated protrusions 413 is formed in the touching area 402. Each insulated protrusion 413 covers at least part of one bridging member 427. An insulated frame 406 is formed in the peripheral area 404. The insulated protrusions 413 and the insulated frame 406 are formed as disclosed in the first embodiment.

Figure 9:
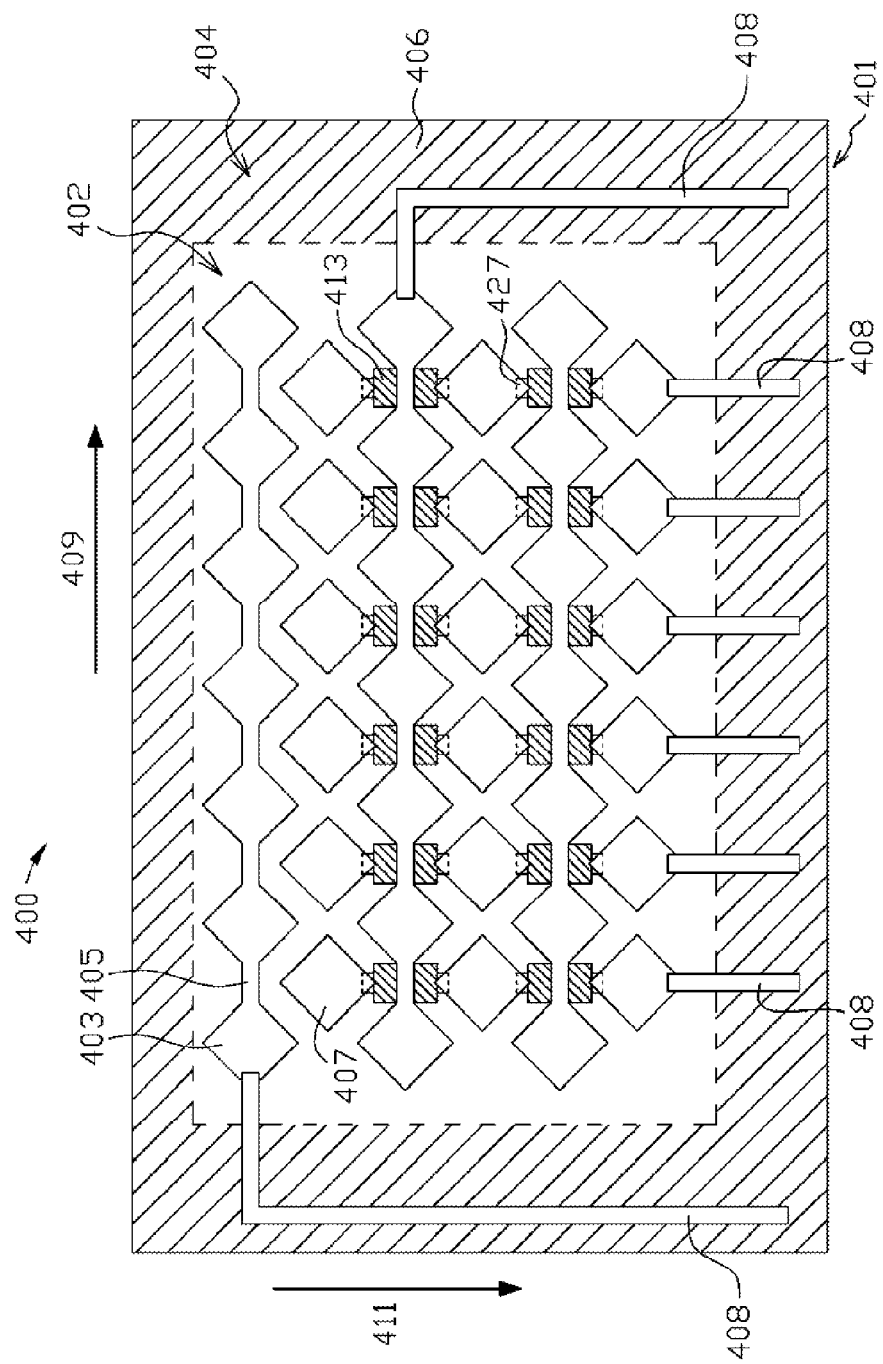

Referring to FIG. 9, a transparent conductive layer (not shown) is formed on the substrate 401, for supporting a plurality of first conductive patterns 403, a plurality of second conductive patterns 407, and a plurality of connecting portions 405 in the touching area 402. The arrangement of the first conductive patterns 403, the second conductive patterns 407, and the connecting portions 405 is substantially the same as that of the first conductive patterns 303, the second conductive patterns 307, and the connecting portions 305 of the first embodiment. Each bridging member 427 connects two second conductive patterns 407, and each connecting portion 405 covers parts of one insulated protrusion 413.

A plurality of conductive wires 408 is formed on the insulated frame 406. Parts of the conductive wires 408 connect with parts of the first conductive patterns 403, respectively. The other parts of the conductive wires 408 connect with parts of the second conductive patterns 407, respectively. Then a protective layer (not shown) is formed on the substrate 401 and covers the entire touching area 402 and the entire peripheral area 404. Thus, a capacitance touch panel module 400 with a higher transmittance is formed.

Referring to FIGS. 6 through 9, the second embodiment of the method of fabricating a capacitance touch panel module is described in the following: in step S601, a substrate 401 comprising a touching area 402 and a peripheral area 404 around the touching area 402 is provided; in step S603, a bridging member 427 is formed in the touching area 402; in step S605, a plurality of insulated protrusions 413 in the touching area 402 and an insulated frame 406 in the peripheral area 404 are formed, wherein each insulated protrusion 413 at least partially covers one bridging member 427; in step S607, a plurality of first conductive patterns 403, a plurality of second conductive patterns 407, and a plurality of connecting portions 405 are formed, in which the first conductive patterns 403 are arranged in a plurality of rows along a first orientation 409, the second conductive patterns 407 are arranged between neighboring rows of the first conductive patterns 403, and wherein each connecting portion 405 connects two neighboring first conductive patterns 403 arranged in a row, each bridging member 427 connects two neighboring second conductive patterns 407, and the first conductive patterns 403 are electrically insulated from the second conductive patterns 407.

The capacitance touch panel modules 300, 400 set the substrate 301, 401 as the touching portion, such that no protective lens is needed in the capacitance touch panel modules 300, 400, which thereby able to provide higher transmittance. The touching structures of the capacitance touch panel modules 300, 400 are formed by lithography or photo etching, such that no optical adhesive is required in the fabrication method.

Finally, while various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. A capacitance touch panel, comprising:
   a substrate comprising a touching area and a peripheral area, wherein the peripheral area is around the touching area;
   a plurality of insulated protrusions in the touching area;
   an insulated frame corresponding to the peripheral area;
   a plurality of first conductive patterns arranged in a plurality of rows along a first orientation;
   a plurality of second conductive patterns arranged in a plurality of columns along a second orientation, wherein the second conductive patterns are electrically insulated from the first conductive patterns; and
   a plurality of connecting portions, wherein each connecting portion connects two neighboring first conductive patterns arranged in a row;
   a plurality of bridging members, wherein each bridging member connects two neighboring second conductive patterns in a column; and
   an overlapping region, wherein the overlapping region is the area that one of the connecting portions overlaps one of the insulated protrusions;
   wherein one of the insulated protrusions has a curved surface, and covers one of the connecting portions; and
   wherein one of the bridging members along the second orientation is longer than the overlapping region along the first orientation.

2. The capacitance touch panel of claim 1, wherein one of the insulated protrusions covers one of the connecting portions, and one of the bridging members crosses one of the insulated protrusions.

3. The capacitance touch panel of claim 1, wherein one of the insulated protrusions covers one of the bridging members, and one of the connecting portions crosses one of the insulated protrusions.

4. The capacitance touch panel of claim 1 further comprising a plurality of conductive wires on the insulated frame, connecting to the first conductive patterns and the second conductive patterns.

5. The capacitance touch panel of claim 4, wherein the conductive wires extend from the first conductive patterns or the second conductive patterns to a top surface of the insulated frame.

6. The capacitance touch panel of claim 1, wherein the insulated protrusions and the insulated frame are made of light absorbing materials.

7. The capacitance touch panel of claim 1 further comprising a protective layer covering the touching area and the peripheral area.

8. A method of fabricating a capacitance touch panel, comprising:
   providing a substrate comprising a touching area and a peripheral area, wherein the peripheral area is around the touching area;
   forming a plurality of insulated protrusions in the touching area;
   forming an insulated frame corresponding to the peripheral area;
   forming a plurality of first conductive patterns arranged in a plurality of rows along a first orientation;

forming a plurality of second conductive patterns arranged in a plurality of columns along a second orientation, wherein the second conductive patterns are electrically insulated from the first conductive patterns;

forming a plurality of connecting portions, wherein each connecting portion connects two neighboring first conductive patterns arranged in a row;

forming a plurality of bridging members, wherein each bridging member electrically connects two neighboring second conductive patterns; and forming an overlapping region, wherein the overlapping region is the area that one of the connecting portions overlaps one of the insulated protrusions;

wherein one of the insulated protrusions has a curved surface, and covers one of the connecting portions; and wherein one of the bridging members along the second orientation is longer than the overlapping region along the first orientation.

9. The method of fabricating a capacitance touch panel of claim 8, wherein the insulated protrusions and the insulated frame are made of light absorbing materials.

10. The method of fabricating a capacitance touch panel of claim 8, wherein step of forming the insulated protrusions and step of forming the insulated frame are performed by ink jet printing.

11. The method of fabricating a capacitance touch panel of claim 8, wherein step of forming the plurality of bridging members further comprises forming a plurality of conductive wires on the insulated frame, connecting to the first conductive patterns and the second conductive patterns.

12. The method of fabricating a capacitance touch panel of claim 11, wherein the conductive wires extend from the first conductive patterns or the second conductive patterns to a top surface of the insulated frame.

13. The method of fabricating a capacitance touch panel of claim 8 further comprising forming a protective layer covering the touching area and the peripheral area.

* * * * *